United States Patent [19]

Okumoto et al.

[11] Patent Number: 5,471,481
[45] Date of Patent: Nov. 28, 1995

[54] TESTING METHOD FOR ELECTRONIC APPARATUS

[75] Inventors: Koji Okumoto, Tokyo; Katsumi Matsuno, Kanagawa; Toru Shiono, Tokyo; Toshitaka Senuma, Tokyo; Tokuya Fukuda, Tokyo; Shinji Takada, Kanagawa, all of Japan

[73] Assignee: Sony Corporation, Tokyo, Japan

[21] Appl. No.: 61,731

[22] Filed: May 17, 1993

[30] Foreign Application Priority Data

May 22, 1992 [JP] Japan ................................ 4-154090
May 18, 1992 [JP] Japan ................................ 4-170054

[51] Int. Cl.⁶ .................................................. G06F 11/25
[52] U.S. Cl. ...................... 371/22.3; 324/73.1; 371/22.1; 371/25.1; 371/27
[58] Field of Search .................................. 364/715, 717; 371/22.3, 25, 27, 22.1, 25.1; 324/73 R, 158 R, 73.1

[56] References Cited

U.S. PATENT DOCUMENTS

| | | | |
|---|---|---|---|
| 4,428,060 | 1/1984 | Blum | 364/715 |
| 4,503,537 | 3/1985 | McAnney | 371/25 |
| 4,519,078 | 5/1985 | Komonytsky | 371/25 |
| 4,707,833 | 11/1987 | Tamaru | 371/22.3 |
| 4,710,931 | 12/1987 | Bellay et al. | 371/22.3 |
| 4,764,926 | 8/1988 | Knight et al. | 371/22.3 |
| 4,847,800 | 7/1989 | Daane | 364/717 |
| 4,860,290 | 8/1989 | Daniels et al. | 371/22.3 |
| 4,872,169 | 10/1989 | Whetsel, Jr. | 371/22.3 |
| 4,967,142 | 10/1990 | Sauerwald et al. | 324/73.1 |
| 5,029,166 | 7/1991 | Jarwala et al. | 371/22.1 |
| 5,109,190 | 4/1992 | Sakashita et al. | 371/23.3 |
| 5,270,642 | 12/1993 | Parker | 324/158 R |
| 5,285,152 | 2/1994 | Hunter | 324/158 R |
| 5,321,277 | 6/1994 | Sparks et al. | 371/22.3 |

Primary Examiner—Edward R. Cosimano
Attorney, Agent, or Firm—William S. Frommer; Alvin Sinderbrand

[57] ABSTRACT

A method of testing an electronic apparatus which eliminates a control signal line for setting an integrated circuit to a test mode and a test mode select terminal of an external terminal section and wherein fetching of test data and transfer of the thus fetched test data are performed in an integrated operation. In each of the integrated circuits, a boundary scan control circuit discriminates a category code at the top of data inputted from a serial input terminal to control a pair of switching circuits. When the category code represents a test mode, predetermined terminals of the switching circuits are selected so that input data are sent out to boundary scan cells. Fetching of parallel data from parallel input terminals and transfer to the boundary scan cells are performed at a time.

15 Claims, 14 Drawing Sheets

FIG. 9

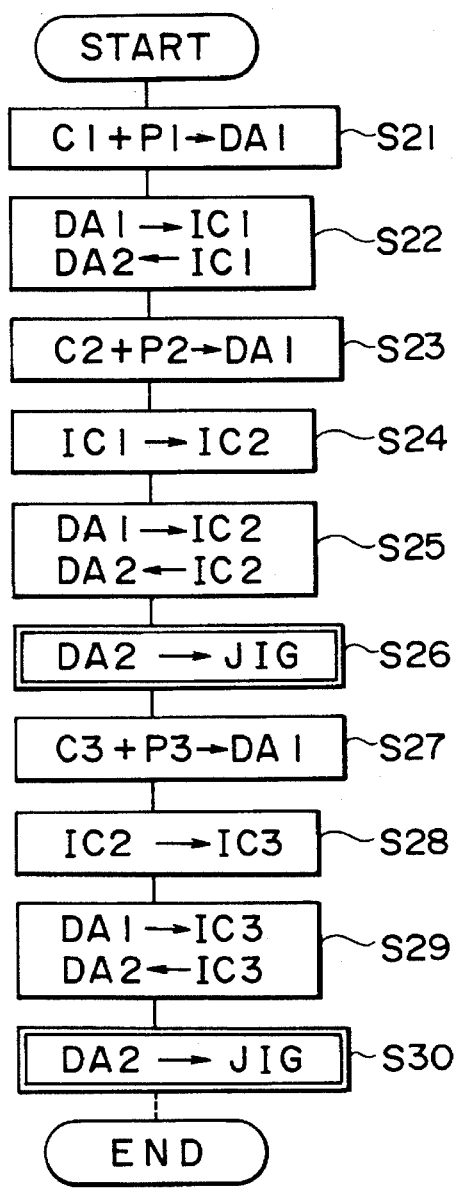

$CX + PX \rightarrow DA1$ :
WRITE COMMAND X & PATTERN X FROM TESTING APPARATUS INTO DATA AREA $DA1 \rightarrow ICX$
$DA2 \leftarrow ICX$ :
EXECUTE SCANNING OF ICX IN ACCORDANCE WITH COMMAND FROM TESTING APPARATUS $DA2 \rightarrow JIG$ :
READ DATA FROM DATA AREA INTO TESTING APPARATUS $ICX \rightarrow ICY$ :
FETCH DATA AT OUTPUT TERMINALS OF ICX TO INPUT TERMINALS OF ICY

5,471,481

TESTING METHOD FOR ELECTRONIC APPARATUS

BACKGROUND OF THE INVENTION

1. Field of the Invention

This invention relates to a method of testing a connection condition of input and output terminals of a plurality of integrated circuits constituting an electronic apparatus.

2. Description of the Related Art

Conventional integrated circuits typically have, as shown in FIG. 12, a plurality of parallel input terminals PI and parallel output terminals PO for data as well as a serial interface SIF by way of which serial communication is performed with a microcomputer or another integrated circuit (IC). The serial interface SIF includes a serial input terminal SI for data, a serial output terminal SO for data, a clock terminal SCK for communication, and a chip select terminal CS for selection of the integrated circuit. In actual integrated circuits, however, the parallel input terminals PI and the parallel output terminals PO are not always arranged regularly in this manner, and some integrated circuits have terminals which are used for both of inputting and outputting operations. Some other integrated circuits have no parallel input terminals. In FIG. 12, the integrated circuit is shown constructed in such a manner as described above only for simplification of description.

When a plurality of such integrated circuits are connected to each other, as shown in FIG. 13, the parallel output terminals PO of a first integrated circuit ICA are connected to the parallel input terminals PI of a second integrated circuit ICB, and the serial input terminals SI, the serial output terminals SO and the clock terminals SCK of the serial interfaces SIF of the integrated circuits ICA and ICB are connected commonly, respectively. Meanwhile, the chip select terminals CS of the integrated circuits ICA and ICB are connected separately from each other to a controlling microcomputer COM so that the microcomputer COM may select the other party of communication by way of the chip select terminals CS to perform time-division communication.

By the way, when a plurality of integrated circuits of the type described above are connected to each other so as to communicate data with each other, it must necessarily be tested whether or not the parallel input terminals PI and the parallel output terminals PO of the integrated circuits are individually connected with certainty. Particularly where a large number of integrated circuits are arranged in a high density on a circuit board of a limited area, wiring processing is complicated, resulting in a problem that it is further difficult to test a connection condition of the wiring lines with certainty.

One solution to this problem is a testing method called boundary scan, which is disclosed, for example, in IEEE Std 1149.1–1990, May 21, 1990. Referring to FIG. 14, an integrated circuit IC11, which is constructed so as to allow the boundary scan, has, in addition to parallel input terminals PI and parallel output terminals PO for data and a serial interface SIF for serial communication, a test interface TIF for boundary scan.

The test interface TIF includes a test serial input terminal TSI for serially inputting data from the outside, a test serial output terminal TSO for outputting inputted test data serially, a test clock input terminal TCK for inputting a clock signal for processing of test data, and a test mode select terminal TMS for inputting an instruction to set the integrated circuit IC11 to a test mode.

Referring now to FIG. 15, the integrated circuit IC11 has, in the inside thereof, boundary scan (S/C) cells BC1 to BC4 corresponding to the input terminals PI1 to PI4 of the parallel input terminals PI between the parallel input terminals PI and a function logic circuit FLG for executing predetermined data processing. Further, boundary scan (S/C) cells BC5 to BC8 are provided corresponding to the output terminals PO5 to PO8 of the parallel output terminals PO between the parallel output terminals PO and the function logic circuit FLG. It is to be noted that the test clock input terminal TCK and the test mode select terminal TMS are omitted in FIG. 15.

FIG. 16(a) shows an exemplary detailed construction of the boundary scan cells BC1 to BC4 of FIG. 15 while FIG. 16(b) shows an exemplary detailed construction of the boundary scan cells BC5 to BC8.

Referring first to FIG. 16(a), data inputted by way of an input terminal PIi (in the arrangement shown in FIG. 15, i is an integer from 1 to 4) is sent out to the function logic circuit FLG and a first input of a multiplexer MUX. Output data from a boundary scan cell at a preceding stage (that is, input data to the test serial input terminal TSI when the boundary scan cell shown is the boundary scan cell BC1, but when the boundary scan cell shown is any of the other boundary scan cells BC2 to BC4, output data from a preceding one of the boundary scan cells BC1 to BC3, respectively) is inputted to a second input of the multiplexer MUX. When the multiplexer MUX is set to a test mode, it fetches data from the input terminal PIi and outputs it to a D-type flip-flop D-FF, but when a signal "SHIFT DR" is inputted to the multiplexer MUX, the multiplexer MUX outputs data received from the boundary scan cell at the preceding stage to the D-type flip-flop D-FF. Then, when a clock signal CLOCK DR is sent out to the D-type flip-flop in this condition, the output of the D-type flip-flop D-FF is transferred to the boundary scan cell at the next stage.

Referring now to FIG. 16(b), data inputted from the function logic circuit FLG is inputted to a first input of a multiplexer MUX. Meanwhile, data inputted from a boundary scan cell at a preceding stage is inputted to a second input of the multiplexer MUX by way of a D-type flip-flop D-FF. When the multiplexer MUX is set to a test mode, the output of the D-type flip-flop D-FF is sent out to an output terminal POj (in the arrangement of FIG. 15, j is an integer from 5 to 8), but in an ordinary operation mode, data inputted from the function logic circuit FLG is sent out to the output terminal POj. The output of the D-type flip-flop D-FF is outputted also to a next stage (that is, to the test serial output terminal TSO when the boundary scan cell shown is the boundary scan cell BC8, but when the boundary scan cell shown is any of the other boundary scan cells BC5 to BC7, to a following one of the boundary scan cells BC6 to BC8, respectively).

It is to be noted that, though not shown, the integrated circuit IC11 of FIG. 15 includes circuits for generating and sending out a signal "SHIFT DR" and a clock signal CLOCK DR to the boundary scan cells and an ordinary signal processing circuit for processing, in an ordinary operation mode, data inputted by way of the serial interface SIF to perform setting of a mode of the function logic circuit FLG, setting of a parameter and so forth.

In a test mode, the integrated circuit IC11 constructed in such a manner as described above operates in the following manner.

1. Serial data of 4 bits inputted by way of the test serial input terminal TSI is stored once into the boundary scan cells BC1 to BC4 and then transferred to the boundary scan cells BC5 to BC8, respectively, in response to a clock signal CLOCK DR, whereafter it is outputted by way of the test serial output terminal TSO.

2. Data of 4 bits inputted parallelly by way of the input terminals PI1 to PI4 is stored once into the boundary scan cells BC1 to BC4 and then transferred to the boundary scan cells BC5 to BC8, respectively, in response to a clock signal CLOCK DR, whereafter it is outputted as serial data by way of the test serial output terminal TSO.

3. Serial data of 4 bits inputted by way of the test serial input terminal TSI is stored once into the boundary scan cells BC1 to BC4 and then transferred to the boundary scan cells BC5 to BC8, respectively, in response to a clock signal CLOCK DR, whereafter it is outputted as parallel data by way of the corresponding output terminals PO5 to PO8, respectively.

The integrated circuit IC11 having the test interface TIF and the boundary scan cells BC1 to BC8 in this manner and integrated circuits IC12 to IC14 having a similar construction are connected to each other in such a manner as shown in FIG. 17, and test data TD in the form of serial data of 4 bits for testing is inputted to the test serial input terminal TSI of the first integrated circuit IC11. The test data TD is stored into the boundary scan cells BC5 to BC8 provided on the parallel output terminals PO side of the integrated circuit IC11 shown in FIG. 15, and then outputted from the parallel output terminals PO to the input terminals PI of the second integrated circuit IC12 connected to the corresponding parallel output terminals PO of the first integrated circuit IC11.

The test data TD inputted to the parallel input terminals PI of the second integrated circuit IC12 is stored into the boundary scan cells (similar to the boundary scan cells BC1 to BC4 of FIG. 15) provided corresponding to the parallel input terminals PI of the second integrated circuit IC12, and then transferred to the boundary scan cells (corresponding to the boundary scan cells BC5 to BC8 of FIG. 15) corresponding to the parallel output terminals PO of the integrated circuit IC12, whereafter it is outputted from the test serial output terminal TSO. Thereafter, the test data TD is inputted to and outputted from each of the integrated circuits IC13 and IC14 similarly by way of the test serial input terminal TSI and the test serial output terminal TSO.

As the test data TD is outputted by way of parallel signal lines between the parallel output terminals PO of the integrated circuit IC11 and the parallel input terminals PI of the integrated circuit IC12, when, for example, "1111" is inputted as the test data TD, if the parallel signal lines between the parallel output terminals PO of the integrated circuit IC11 and the parallel input terminals PI of the integrated circuit IC12 have some disconnection or some incomplete connection, then the serial data outputted from the test serial output terminal TSO of the second integrated circuit IC12 presents "0" only at the bit or bits thereof corresponding to the failed signal line or lines and is outputted, for example, as data of "1011".

Accordingly, the connection condition between the first and second integrated circuits IC11 and IC12 can be tested based on the output data.

It is to be noted that, while, in actual integrated circuits, for example, also the integrated circuits IC11 and IC13 may be connected to each other or the output of the integrated circuit IC12 may be inputted to the integrated circuit IC11, the circuit system wherein the integrated circuits are connected regularly to each other is shown in FIG. 17 for simplified illustration.

FIG. 18 shows a construction of an electronic apparatus testing system which has been proposed upon introduction of the present invention. In FIG. 18, like elements to those of FIGS. 14 and 15 are denoted by like reference characters. The electronic apparatus shown in FIG. 18 was applied for patent in the United States on Jan. 21, 1993 (U.S. Ser. No. 08/006,760), issued as U.S. Pat. No. 5,390,191 on Feb. 14, 1995, and assigned to the same assignee.

Referring to FIG. 18, an electronic apparatus 20 such as a video tape recorder integrated with a camera includes a pair of integrated circuits IC21 and IC22 on a common circuit board. The parallel output terminals PO of the integrated circuit IC21 are connected to the parallel input terminals PI of the integrated circuit IC22 so that data may be communicated between the integrated circuits IC21 and IC22. The serial interfaces SIF of the integrated circuits IC21 and IC22 are individually connected to a microcomputer COM by way of a selector 23 and an internal communication bus 24 so as to perform serial communication between the microcomputer COM and the integrated circuits IC21 and IC22.

In the electronic apparatus 20 of the construction described above, an external terminal section 25 is connected to the selector 23, and when a select terminal SEL of the external terminal section 25 is controlled to a high ("H") level, the selector 23 is changed over from the microcomputer COM to the external terminal section 25 as indicated by broken lines in FIG. 18.

A testing apparatus 27 is connected to the external terminal section 25 by way of a first bidirectional communication bus 26 such that the testing apparatus 27 transmits various control data to the external terminal section 25 and communicates test data from and to the internal communication bus 24 of the electronic apparatus 20 by way of the external terminal section 25.

An external bus interface 28 is connected to the microcomputer COM, and the testing apparatus 27 is connected to the external bus interface 28 by way of an external communication bus 29 serving as a second bidirectional communication bus. The external communication bus 29 is used for communication of data which are used to remote controller control of the electronic apparatus 20, setting of a mode of the integrated circuits IC21 and IC22, setting of a parameter and so forth, and is particularly used here in order to allow the testing apparatus 27 to transmit to the microcomputer COM a notification to conduct a test. The external bus interface 28 and the external communication bus 29 may be, for example, those called LANC (Local Application Control Bus System: a registered trademark) proposed by the applicant of the present application. Detailed description of the LANC is omitted herein since it is disclosed, for example, in U.S. patent application Ser. No. 4,713,702 assigned to the same assignee.

When the select terminal SEL of the external terminal section 25 is controlled to the "H" level by the testing apparatus 27, the selector 23 is changed over from the microcomputer COM to the external terminal section 25. In this condition, the test serial output terminal TSO, the test serial input terminal TSI and the test clock terminal TCK of the external terminal section 25 are connected to the serial input terminals SI, the serial output terminals SO and the clock input terminals SCK, respectively, of the serial interfaces SIF of the integrated circuits IC21 and IC22.

Further, in this instance, a chip select terminal CSA of the external terminal section 25 is connected to the chip select terminal CS of the integrated circuit IC21, and another chip select terminal CSB of the external terminal section 25 is connected to the chip select terminal CS of the integrated circuit IC22. The integrated circuits IC21 and IC22 are thus caused to operate independently of each other using the two chip select terminals CSA and CSB so that data may not be outputted at a time from the serial output terminals SO of the integrated circuits IC21 and IC22 to the external communication bus 24 connected to the serial interfaces SIF.

Here, the test mode select terminal TMS of the external terminal section 25 is connected to the test mode select terminals TMS of the integrated circuits IC21 and IC22 so that the integrated circuits IC21 and IC22 may be set to a test mode in response to the logic level at the test mode select terminal TMS.

In order to conduct a test, first the chip select terminal CSA of the external terminal section 25 is changed to the "H" level to select the integrated circuit IC21, and the test mode select terminal TMS of the external terminal section 25 is changed to the "H" level to put the integrated circuit IC21 into a test mode. Then, test data is inputted to the serial input terminal SI of the integrated circuit IC21 while a clock signal is inputted to the clock input terminal SCK of the integrated circuit IC21. The test data thus inputted is transferred from the boundary scan cells BC1 to BC4 (not shown in FIG. 18) to the boundary scan cells BC5 to BC8 (not shown in FIG. 18) in synchronism with the clock signal inputted to the clock input terminal SCK of the integrated circuit IC21. In this condition, the chip select terminal CSA of the external terminal section 25 is changed to a low ("L") level to put the integrated circuit IC21 into a hold mode so as to hold the data in the boundary scan cells BC5 to BC8.

Subsequently, the chip select terminal CSB of the external terminal section 25 is changed to the "H" level to select the integrated circuit IC22, and the test mode select terminal TMS of the external terminal section 25 is changed to the "H" level to set the integrated circuit IC22 to a test mode. Then, the integrated circuit IC 22 fetches the data held in the boundary scan cells BC5 to BC8 of the integrated circuit IC21 into the parallel input terminal PI. Subsequently, the test data fetched into the parallel input terminals PI of the integrated circuit IC22 are transferred from the boundary scan cells BC1 to BC4 to the boundary scan cells BC5 to BC8, respectively, of the integrated circuit IC22 and then outputted from the serial output terminal SO of the integrated circuit IC22 in synchronism with a clock signal inputted to the clock input terminal SCK of the integrated circuit IC22.

In the testing system described above, the integrated circuits IC21 and IC22 have no test interface TIF, but each inputs test data at the serial interface SIF thereof. Therefore, each of the integrated circuits IC21 and IC22 requires a switching circuit for sending out, in an ordinary operation mode, data inputted by way of the serial interface SIF to an ordinary signal processing circuit, but sending out, in a test mode, data inputted by way of the serial interface SIF to the boundary scan cells. Meanwhile, since the test interface TIF is eliminated, the integrated circuit is simplified in construction.

However, the electronic apparatus testing system of FIG. 18 requires, in addition to the communication lines for communicating test data between the testing apparatus and the integrated circuits, an additional control signal line for putting the integrated circuits into a test mode. Consequently, where a plurality of integrated circuits are provided in an electronic apparatus, a number of control signal lines equal to the number of integrated circuits are wired on a circuit board, and the circuit board is required to have an additional occupation area for the control lines. Also the external terminal section requires the test mode select terminal TMS for connection to the control signal lines.

Further, since an operation of fetching test data by way of the parallel input terminals of an integrated circuit and another operation of transferring the thus fetched test data are separate from each other, a circuit for realizing such separate operations is required, resulting in complicated construction and increase in size of the integrated circuit.

SUMMARY OF THE INVENTION

It is an object of the present invention to provide a method of testing an electronic apparatus which eliminates a control signal line for setting an integrated circuit to a test mode and a test mode select terminal of an external terminal section.

It is another object of the present invention to provide a method of testing an electronic apparatus wherein fetching of test data and transfer of the thus fetched test data are performed in an integrated operation.

In order to attain the objects described above, according to an aspect of the present invention, there is provided a method of testing, using a boundary scanning system, a connection condition between input and output terminals of each adjacent ones of a plurality of integrated circuits constituting an electronic apparatus, wherein boundary scan data to be inputted to the integrated circuits is constituted from first data for setting the integrated circuits to a test mode and second data to be inputted to boundary scan cells of the integrated circuits, and each of the integrated circuits includes a circuit for discriminating presence or absence of the first data, and when the circuit detects the first data, the second data is inputted to the boundary scan cells.

With the testing method, when an integrated circuit which detects the first data is put into a test mode at the point of time, and the second data following the first data is inputted as scan data into the boundary scan cells. Consequently, boundary scanning can be controlled only with lines which transmit data therethrough, and accordingly, a control signal line for setting an integrated circuit into a test mode is unnecessary. Further, where boundary scan data is inputted by way of an external terminal section, a test mode select terminal of the external terminal section is unnecessary.

Further, a second one of the integrated circuits executes fetching of test data and transfer of the thus fetched test data.

According to another aspect of the present invention, the testing method is performed on an apparatus for testing a connection condition of an integrated circuit apparatus which includes first and second integrated circuits each having a plurality of data input/output terminals for at least inputting or outputting data, a serial input terminal and a serial output terminal for serial communication, a clock terminal, and a chip select terminal, and wherein data are communicated between the input/output terminals of the first integrated circuit and the data input/output terminals of the second integrated circuit corresponding to the data input/output terminals of the first integrated circuit, which comprises discrimination means provided in each of the first and second integrated circuits for receiving a test mode select command to set the first and second integrated circuits to a test mode by way of the serial input terminal and for discriminating the operation mode between the test mode and an ordinary operation mode, boundary scan cells provided in each of the first and second integrated circuits corresponding to the data input/output terminals of the first and second integrated circuits, a check system for generating predetermined test data and the test mode select command signal, receiving resulted data of the first and second integrated circuits after the test data is scanned in the first and second integrated circuits and comparing the data generated from the check system and the resulted data, a microcomputer for controlling transmission of the test mode select command signal and the test data from the check system and reception of the resulted data by the check system, and a bidirectional external bus interface for establishing communication between the microcomputer and the check system.

With the testing method and apparatus of the present invention, the following advantages can be anticipated.

1. Since a control signal line for setting an integrated circuit to a test mode is unnecessary, the area of a circuit board for the integrated circuits is reduced.

2. When binary scan data is to be inputted by way of an external terminal section, a test mode select terminal of the external terminal section can be eliminated.

3. Since fetching of test data and transfer of the thus fetched test data are performed in a simultaneous operation, reduction in size of the circuit for realizing the operations can be realized.

4. Since a switching apparatus for exclusive use for switching between an external terminal section and a communication bus is unnecessary, simplification of the testing apparatus and reduction in number of parts of an electronic apparatus can be achieved.

5. Since, when an electronic apparatus is viewed from the testing apparatus, communication of data is performed to and from a data area (RAM) on an imaginary space of a microcomputer, there is no necessity of becoming aware of the internal structure of the electronic apparatus.

6. The testing apparatus is only required to support the protocol on the external communication bus.

7. Since a test of test data is performed with the testing apparatus, even when the integrated circuits are modified, it is possible to cope with this only by changing commands and/or boundary scan data to be transmitted from the testing apparatus. Accordingly, the necessity of a change of a program of a microcomputer of an electronic apparatus is eliminated.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 9 is a flow diagram illustrating a testing procedure of the electronic apparatus testing system of FIG. 1;

DETAILED DESCRIPTION OF THE INVENTION

Figure 1:
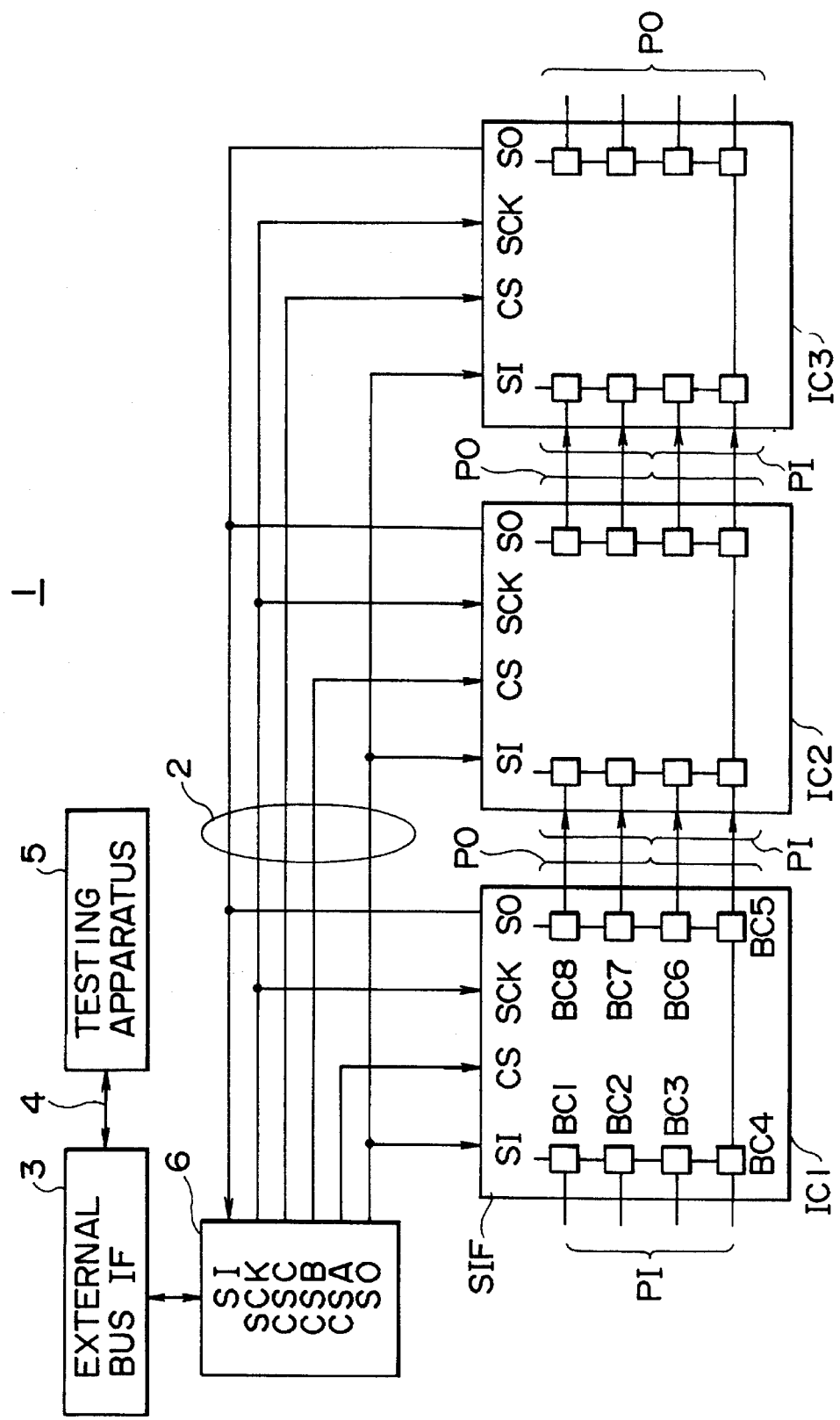
FIG. 1 is a block diagram showing an electronic apparatus testing system to which the present invention is applied.

Referring first to FIG. 1, there is shown an electronic apparatus testing system to which the present invention is applied. An electronic apparatus 1 such as, for example, a video tape recorder integrated with a camera includes a plurality of integrated circuits (ICs) provided on a single circuit board. In FIG. 1, only three of the integrated circuits, that is, integrated circuits IC1 to IC3, are shown. Parallel output terminals PO of the integrated circuit (IC) IC1 are connected to parallel input terminals PI of the integrated circuit IC2 while parallel output terminals of the integrated circuit IC2 are connected to parallel input terminals PI of the integrated circuit IC3 so that data may be communicated between the integrated circuits IC1 and IC2 and between the integrated circuits IC2 and IC3.

Serial interfaces SIF of the integrated circuits IC1 to IC3 are connected to a microcomputer 6 by way of an internal communication bus 2 so that serial communication may be performed between the microcomputer 6 and the integrated circuits IC1 to IC3.

Figure 18:
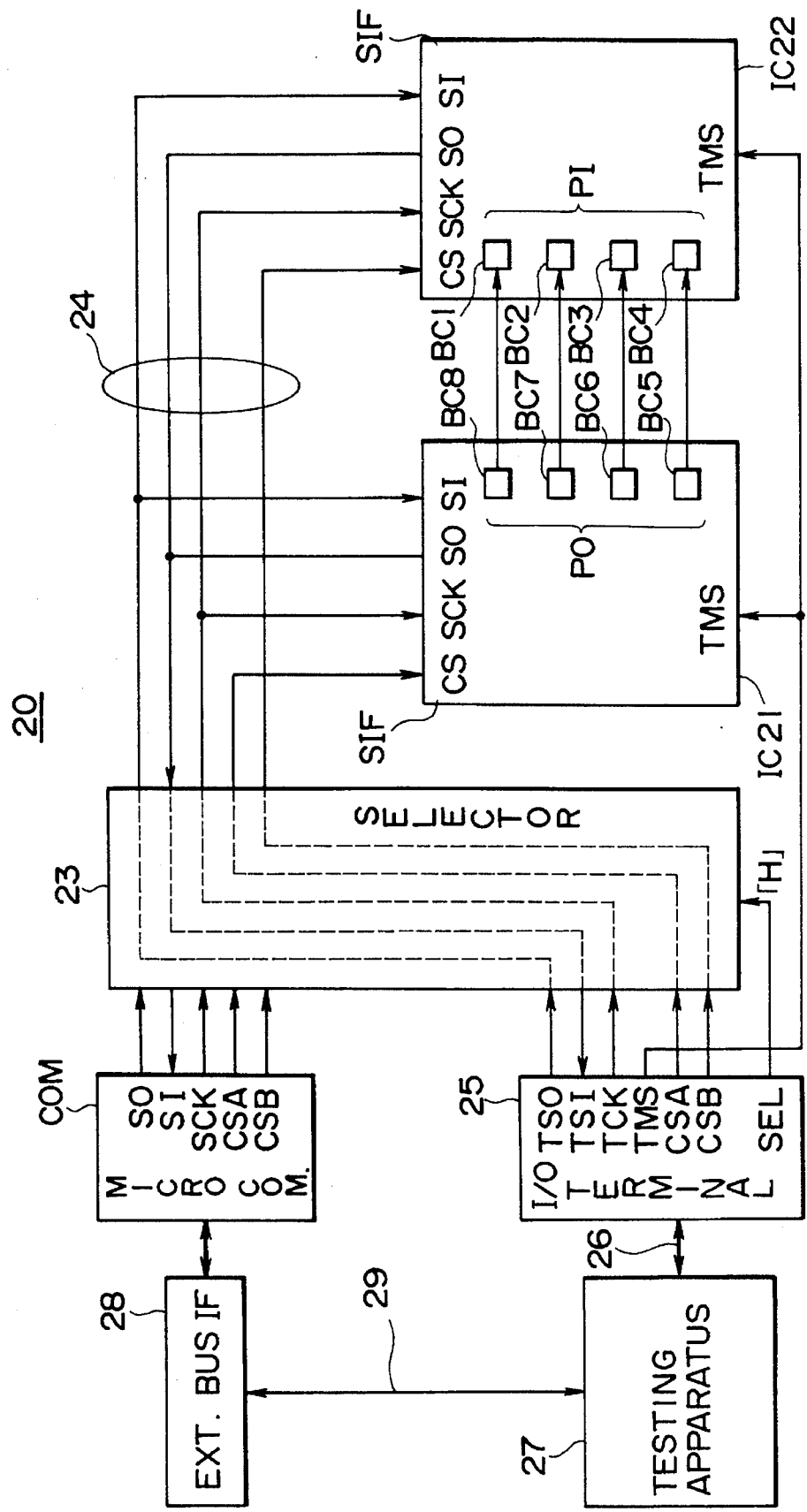
FIG. 18 is a block diagram showing a construction of an electronic apparatus testing system proposed by the same assignee.

The microcomputer 6 in the electronic apparatus 1 constructed in such a manner as described above is connected to a testing apparatus 5 by way of an external bus interface 3 and an external communication bus 4. The external bus interface 3 and the external communication bus 4 may be, for example, the LANC described hereinabove with reference to FIG. 18 and is used for remote controller control of the electronic apparatus 1, setting of a mode of the integrated circuits IC1 to IC3, setting of a parameter and so forth. Here, the testing apparatus 5 performs communication of test data, transmission of commands and so forth to and from the microcomputer 6.

Figure 2:
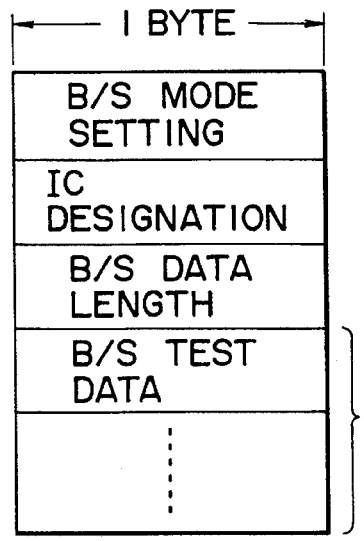
FIG. 2 is a diagrammatic view illustrating a construction of data to be transmitted from a testing apparatus to a microcomputer of the electronic apparatus testing system of FIG. 1.

Referring now to FIG. 2, there is shown a construction of data to be transmitted from the testing apparatus 5 to the microcomputer 6 in the electronic apparatus testing system shown in FIG. 1. The data includes an IC designating command for designating an integrated circuit into which boundary scan (B/S) data is to be written, a data length of the boundary scan data to be written into boundary scan (B/S) cells of the integrated circuit, test data to be transmitted from the microcomputer 6 to the integrated circuit and a boundary scan (B/S) mode setting command. The boundary scan mode setting command is a command to send boundary scan data to a designated integrated circuit. Accordingly, actually another command to set the microcomputer 6 itself to a boundary scan mode is necessitated separately.

Figure 3:
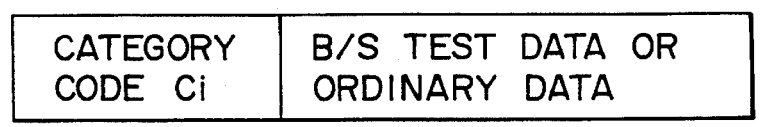
FIG. 3 is a diagrammatic view illustrating a construction of data to be transmitted from the microcomputer of the electronic apparatus testing system of FIG. 1 to an integrated circuit.

FIG. 3 illustrates a construction of data to be transmitted from the microcomputer 6 in the electronic apparatus testing system of FIG.1 to a serial input terminal SI of an integrated circuit. Referring to FIG. 3, the data includes a category code $C_i$ produced from the boundary scan data by the microcomputer 6 for setting an integrated circuit to a test mode or an ordinary operation mode, and boundary scan data or ordinary data to be inputted to an integrated circuit to which setting of a mode has been performed. The category code $C_i$ may be constituted from one bit of "0" or "1" in principle, but preferably is constituted from several bits. Particularly, when each integrated circuit has a plurality of functions to be used switchably, the category code $C_i$ is constituted from a plurality of bits.

Figure 4:
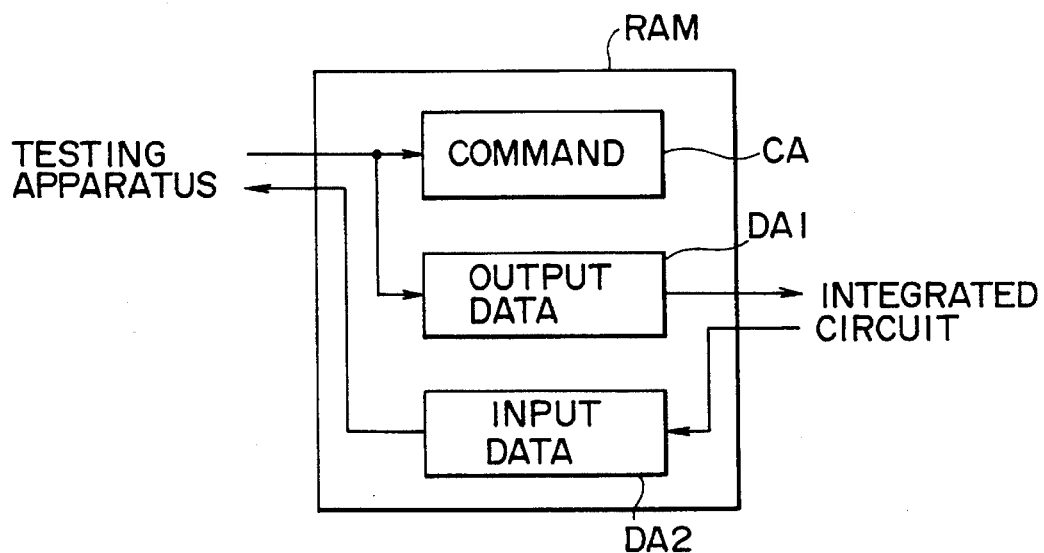
FIG. 4 is a diagrammatic view showing a construction of a RAM of the microcomputer of FIG. 1.

Referring now to FIG. 4, there is shown a construction of a RAM of the microcomputer 6 in the electronic apparatus testing system of FIG. 1. The RAM has a command area CA for storing therein such a boundary scan mode setting command, a boundary scan data length and an integrated circuit designating command as illustrated in FIG. 2, an output data area DA1 for storing therein boundary scan data inputted from the testing apparatus and to be outputted to an integrated circuit, and an input data area DA2 for storing therein boundary scan data inputted from an integrated circuit.

Figure 5:
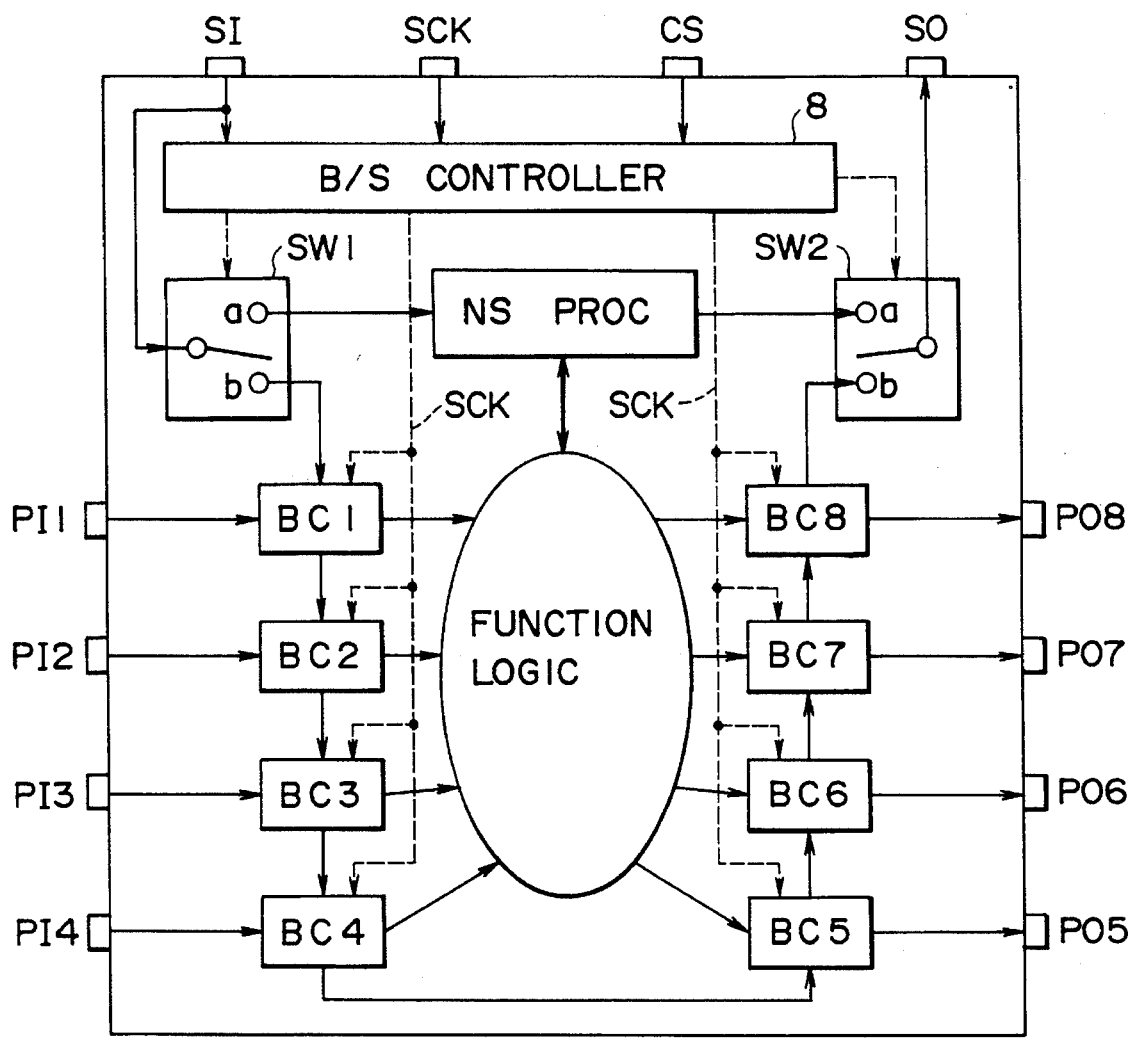
FIG. 5 is a block diagram showing a construction of an integrated circuit for boundary scan to be tested by the electronic apparatus testing system of FIG. 1.
Figure 15:
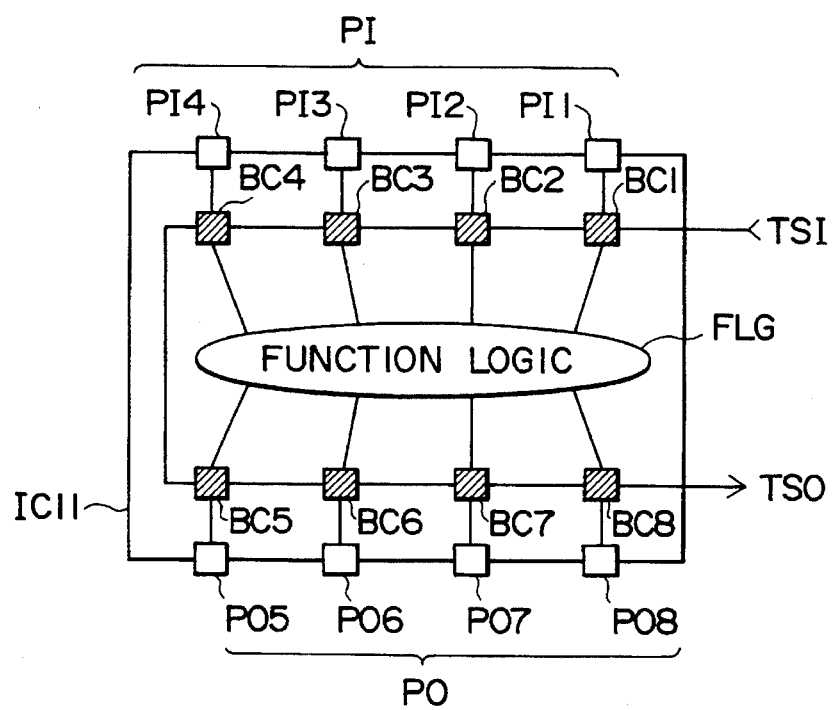
FIG. 15 is a block diagram showing an internal construction of the integrated circuit for boundary scan shown in FIG. 14.
Figure 16A:
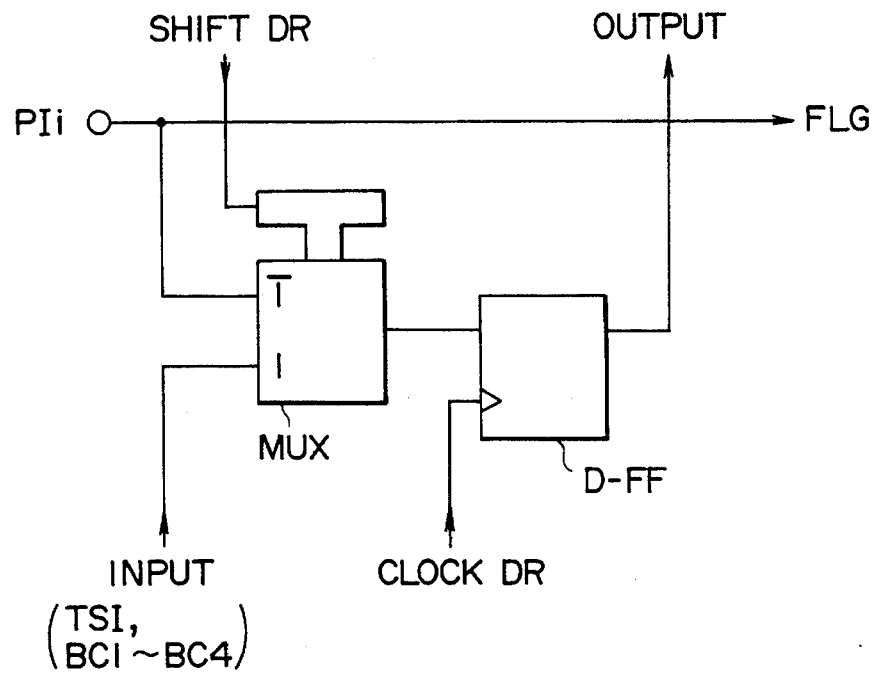
FIGS. 16(a) and 16 (b) are block diagrams showing constructions of conventional boundary scan cells.
Figure 16B:
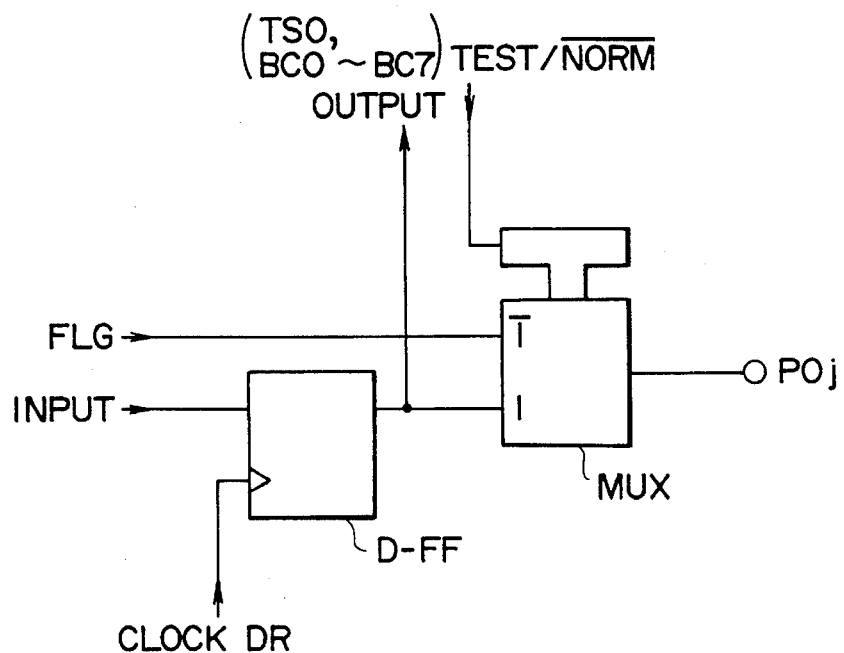
Figure 17:
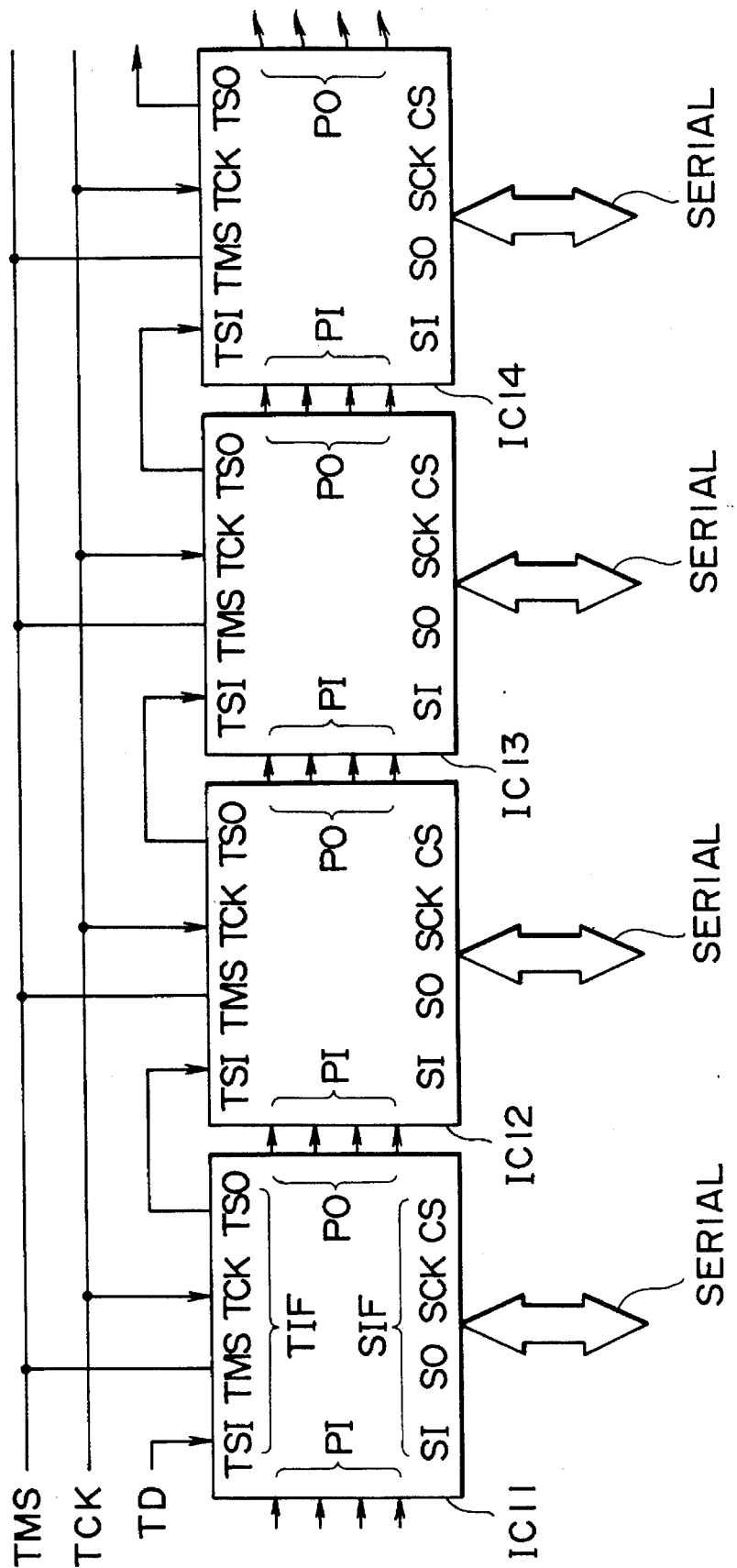
FIG. 17 is a diagrammatic view showing a plurality of integrated circuits for which boundary scanning is performed.

Referring now to FIG. 5, there is shown a construction of an integrated circuit for boundary scan, which is tested by the electronic apparatus testing system of FIG. 1. The integrated circuit for boundary scan shown is a modification to or an improvement in the conventional integrated circuit for boundary scan described hereinabove with reference to FIG. 15. In particular, the integrated circuit for boundary scan is constructed such that a boundary scan control circuit 8 discriminates the category code $C_i$ at the top of data inputted by way of a serial input terminal SI and controls a pair of switching circuits SW1 and SW2 in accordance with a result of the discrimination. If the category code $C_i$ indicates a test mode, then the boundary scan control circuit 8 selects terminals b of the switching circuits SW1 and SW2 so that inputted data are transferred to boundary scan cells BC1 to BC8, but on the other hand, if the category code $C_i$ indicates an ordinary operation mode, then the boundary scan control circuit 8 selects the other terminals a of the switching circuits SW1 and SW2 so that inputted data are transferred to an ordinary signal processing circuit not shown of the integrated circuit for boundary scan. Here, the switching circuits SW1 and SW2 may have a similar construction to that of the multiplexer MUX shown in FIG. 16. Meanwhile, the ordinary signal processing circuit may be constituted from a plurality of registers and executes setting of a mode of the integrated circuit IC1 to IC3 and processing of data in an ordinary operation mode such as setting of a parameter. It is to be noted that control signals inputted from the boundary scan control circuit 8 to the boundary scan cells BC1 to BC8 and represented by broken lines in FIG. 5 are clock signals SCK.

Figure 6:
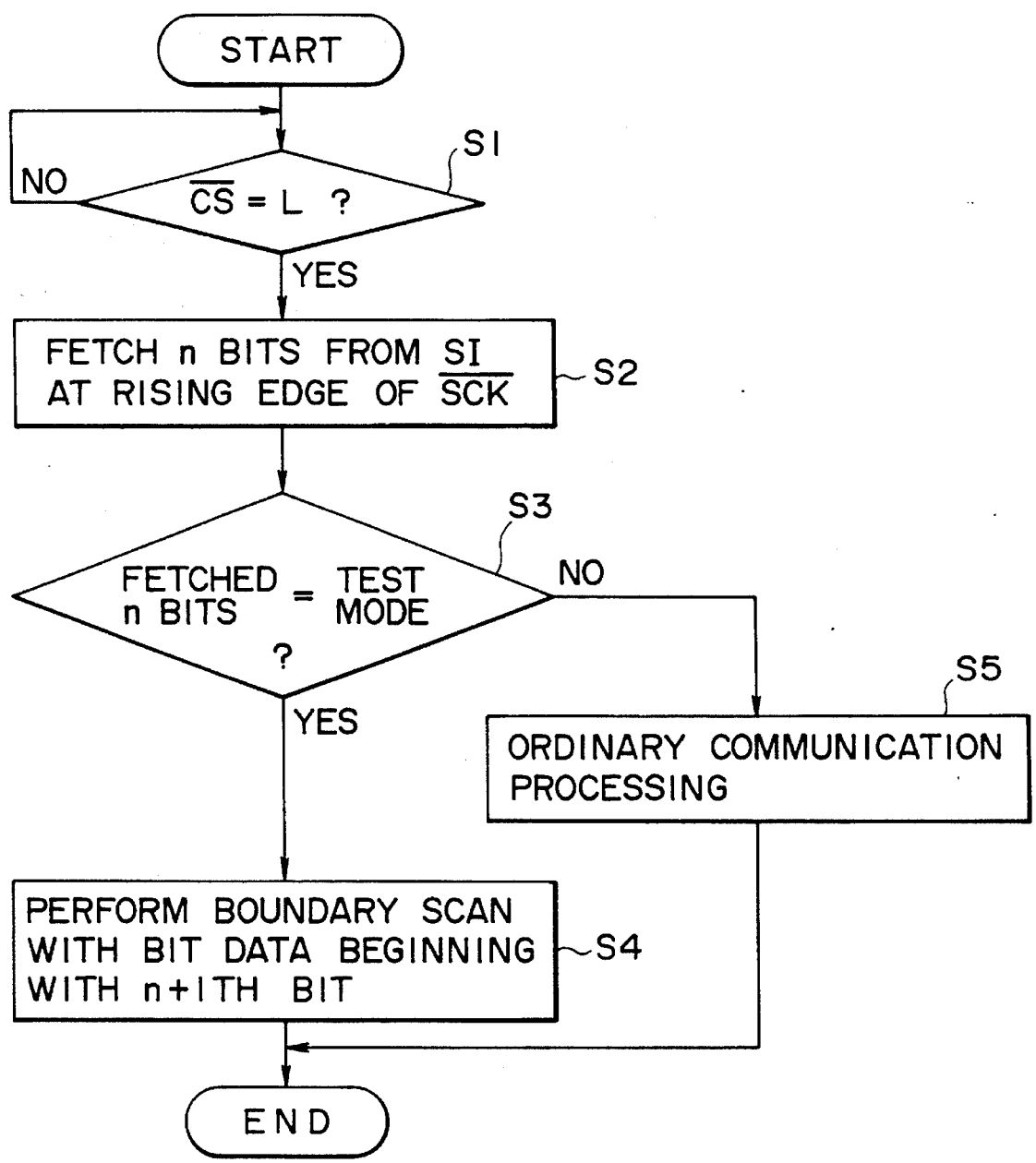
FIG. 6 is a flow chart illustrating the operation of a boundary scan control circuit of the electronic apparatus testing system of FIG. 1.
Figure 7:
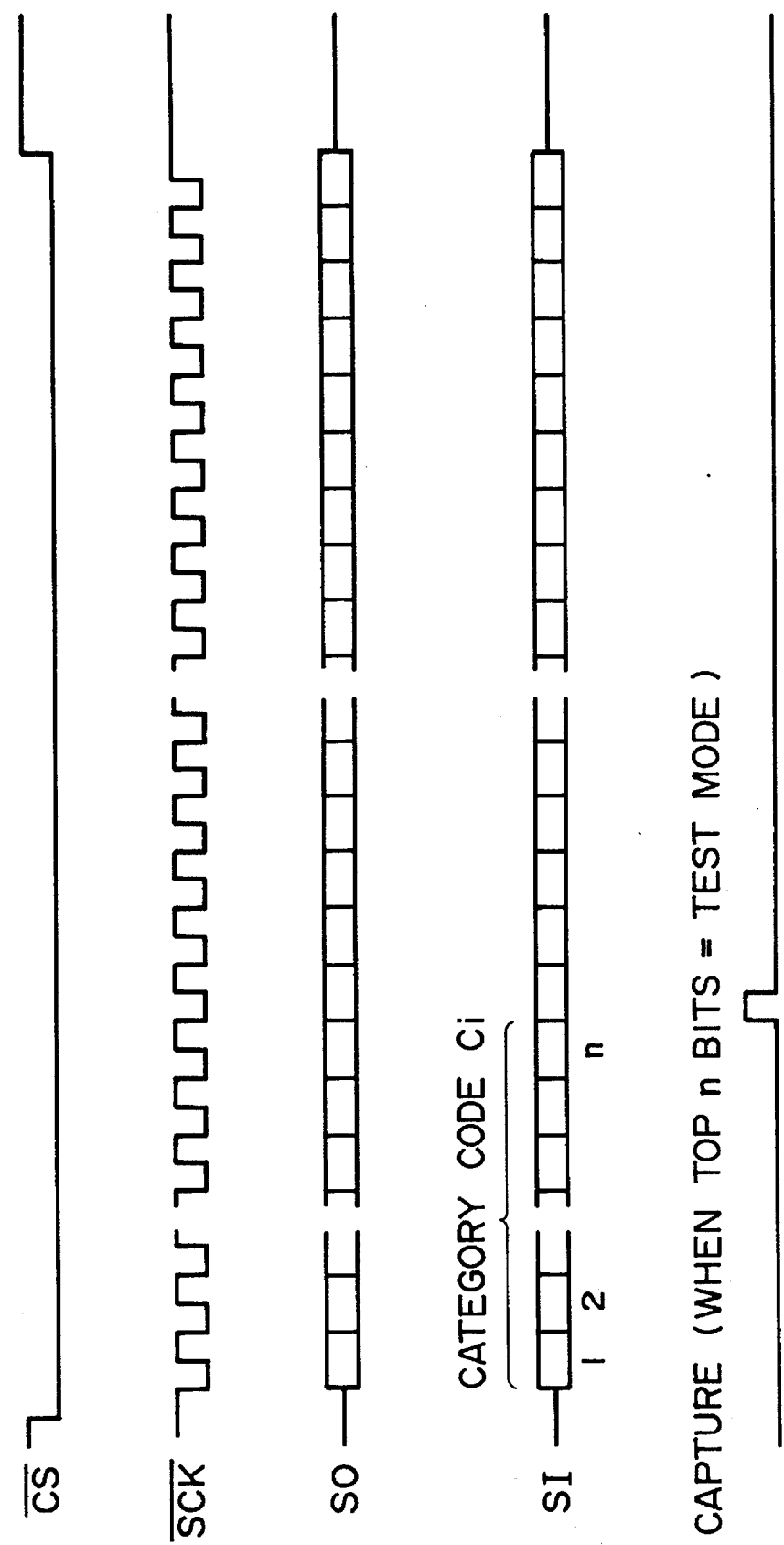
FIG. 7 is a time chart illustrating the operation of the integrated circuit for boundary scan.
Figure 8:
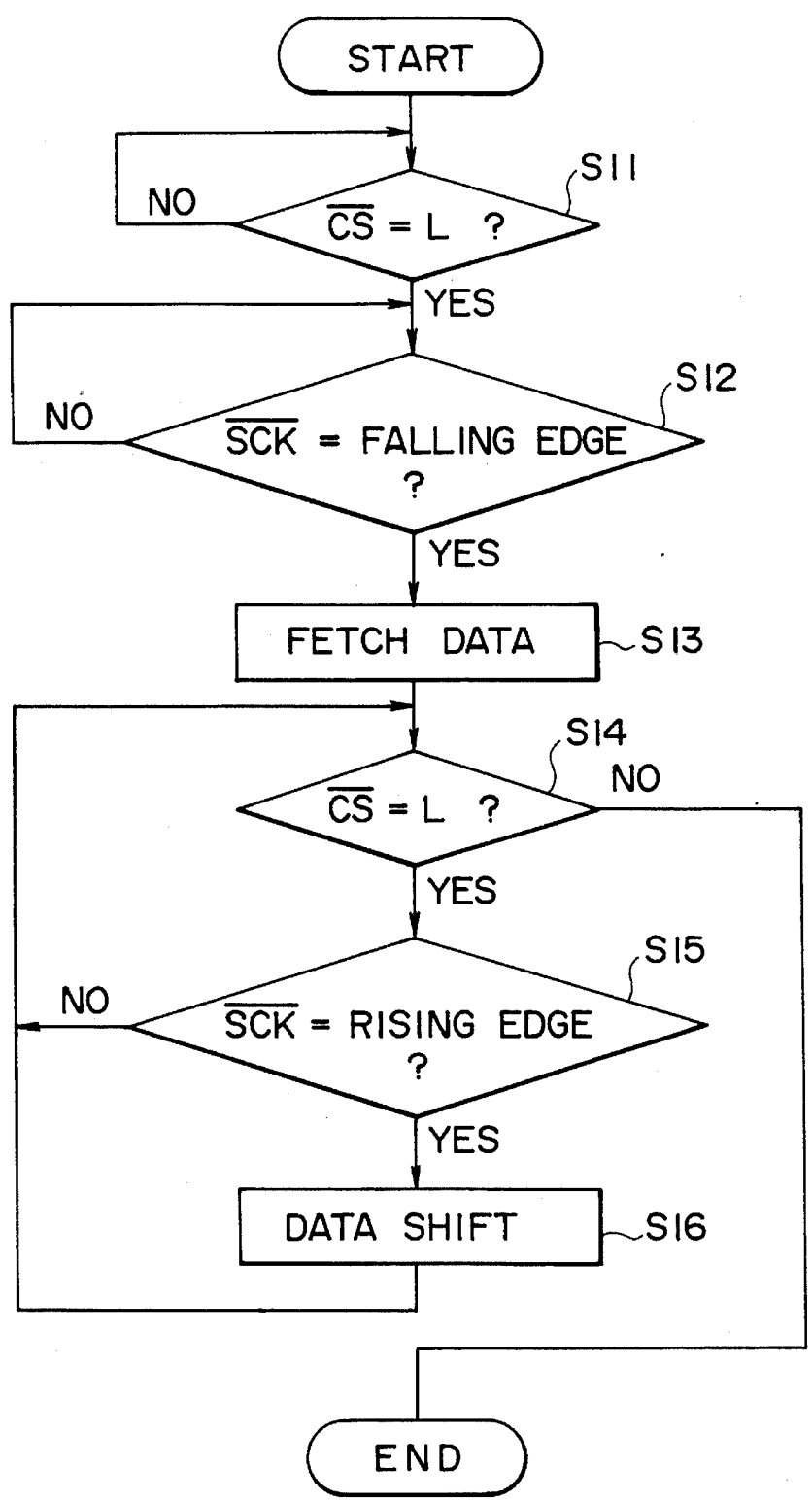
FIG. 8 is a time chart illustrating the operation of the boundary scan control circuit.

Operation of the integrated circuit for boundary scan shown in FIG. 5 is illustrated in FIGS. 6 to 8. Referring first to FIG. 5 and also to FIG. 6 which illustrates operation of the boundary scan control circuit 8 of the integrated circuit for boundary scan, the boundary scan control circuit 8 first discriminates the level of an input signal to the chip select terminal CS, and if the input signal level is the "L" level (= active), then the boundary scan control circuit 8 fetches the category code $C_i$ of the first n bits inputted to the serial input terminal SI in response to a rising edge of the clock signal SCK (steps S1 and S2). Then, if the n bits thus fetched indicate a test mode, then the boundary scan control circuit 8 selects the terminals b of the switching circuits SW1 and SW2 so that boundary scan is performed with following bit data beginning with the n+1th bit of the data inputted to the serial input terminal SI. On the other hand, if the n bits fetched indicate an ordinary operation mode, the boundary scan control circuit 8 selects the other terminals a of the switching circuits SW1 and SW2 so that ordinary signal processing is executed (steps S3, S4 and S5).

Referring now to FIG. 5 and FIGS. 7 and 8 which illustrate a boundary scanning operation of the integrated circuit for boundary scan shown in FIG. 5, the boundary scan control circuit 8 first discriminates the level of an input signal to the chip select terminal CS, and if the input signal level is the "L" level (= active), then the boundary scan control circuit 8 fetches test data inputted to the parallel input terminals PI into the boundary scan cells BC1 to BC4 in response to a falling edge of a first clock of the clock signal SCK (steps S11 to S13 in FIG. 8; the waveform "CAPTURE" in FIG. 7). Then, the boundary scan control circuit 8 discriminates the level of the input signal to the chip select terminal CS, and if the input signal level is the "L" (=active), then the boundary scan control circuit 8 outputs the test data, which have been inputted by way of the serial input terminal SI and fetched into the boundary scan cells BC1 to BC4 and is constituted from bit data of bits beginning with the n+1th bit, from the serial output terminal SO by way of the boundary scan cells BC5 to BC8 in response to rising edges of clocks of the clock signal SCK after the first clock (steps S14 to S16).

It is to be noted that, when the category code $C_i$ indicates an ordinary operation mode, the signal CAPTURE illustrated in FIG. 7 is not used, but data for an ordinary operation mode inputted from the serial input terminal SI is sent out from the switching circuit SW1 to the ordinary signal processing circuit and then outputted from the serial output terminal SO by way of the switching circuit SW2.

Subsequently, a procedure when the connection condition between the parallel output terminals PO of the integrated circuit IC1 and the parallel input terminals PI of the integrated circuit IC2 and the connection condition between the parallel output terminals PO of the integrated circuit IC2 and the parallel input terminals PI of the integrated circuit IC3 are successively tested will be described with reference to FIGS. 1 to 11.

First, the testing apparatus 5 sets the microcomputer 6 to a boundary scan mode by way of the external communication bus 4 and the external bus interface 3. In the boundary scan mode, the microcomputer 6 stops its ordinary operation and enters a boundary scan mode setting command waiting condition.

Subsequently, the testing apparatus 5 sends out such data as illustrated in FIG. 2 to the microcomputer 6. Upon reception of the data, the microcomputer 6 stores the integrated circuit designating command, the boundary scan data length and the boundary scan mode setting command included in the received data into the command area CA of the RAM thereof and stores the transmission data of the received data into the data area DA1 (step S21 in FIG. 9). Here, the transmission data includes the category code C1 for setting the integrated circuit IC1 to a test mode and data P1= "11110000" for setting the parallel output terminals PO of the integrated circuit IC1 to test data "1111"; the IC designating command is a command designating the integrated circuit IC1; and the boundary scan mode setting command is a command to transmit the boundary scan data stored in the output data area DA1 of the RAM to an integrated circuit and store data read out from the integrated circuit into the input data area DA2 of the RAM. In this instance, data, which have been stored in an ordinary operation mode, still remain in the integrated circuits IC1 to IC3 (refer to the mark * in FIG. 10(a)).

Subsequently, the microcomputer 6 reads the IC designating command stored in the command area CA of the RAM and controls the chip select terminal CSA thereof to the "L" level to select the integrated circuit IC1, whereafter it reads out the category code C1 and the data P1 from the output data area DA1 of the RAM and transmits them to the serial input terminal SI of the integrated circuit IC1. The boundary scan control circuit 8 in the integrated circuit IC1 discriminates that the category code C1 represents a test mode, and changes over the switching circuits SW1 and SW2 to the terminals b side so that the data Pi ="11110000" is transferred to the boundary scan cells BC1 to BC8 in synchronism with a clock signal inputted to the clock terminal SCK Thereupon, the data "********" which has been stored into the integrated circuit IC1 before the test mode is entered, is read out by way of the serial output terminal SO of the integrated circuit IC1 and stored into the input data area DA2 of the integrated circuit IC1 (step S22). The data may be abandoned since it is not used for the test of the integrated circuit IC1 Since the test data "1111" which is the former half of the inputted data P1 is stored into the boundary scan cells BC5 to BC8 connected to the parallel output terminals PO of the integrated circuit IC1, the test data "1111" appears at the parallel output terminals PO. Since the data "0000" of the latter half is not used for the test, any other arbitrary bit pattern may be employed instead. After the transmission to the serial input terminal SI is completed, the microcomputer 6 controls the chip select terminal CSA thereof to the level. Consequently, the integrated circuit IC1 is controlled to a hold mode. In the hold mode, the state of the integrated circuit IC1 does not change, and the data at the parallel output terminals PO of the integrated circuit IC1 maintains the test data "1111".

Subsequently, the testing apparatus 5 transmits the data illustrated in FIG. 2 to the microcomputer 6. Upon reception of the data, the microcomputer 6 stores the data into the command area CA and the output data area DA1 of the RAM similarly as at step S21 (step S23 in FIG. 9). Here, the boundary scan data of the received data includes the category code C2 for setting the integrated circuit IC2 to a test mode and data P2= "11110000" for setting the parallel output terminals PO of the integrated circuit IC2 to the test data "1111"; and the IC designating command is a command designating the integrated circuit IC2. In this instance, the data P2 may be overwritten with the data P1, which has been stored into the output data area DA1 at step S21 in FIG. 9, or otherwise be stored into another region of the output data area DA1. In the present embodiment, the data P2 is overwritten with the data P1 in order to save the RAM.

Figure 10A:
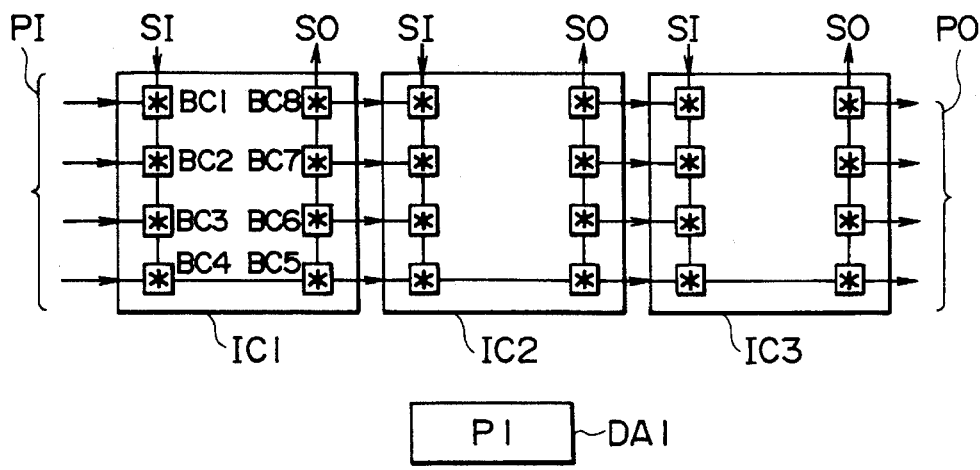
FIGS. 10(a) to 10(c) and 11(a) to 11(c) are diagrammatic views showing conditions of integrated circuits at different steps of the operation illustrated in FIG. 9.
Figure 10B:
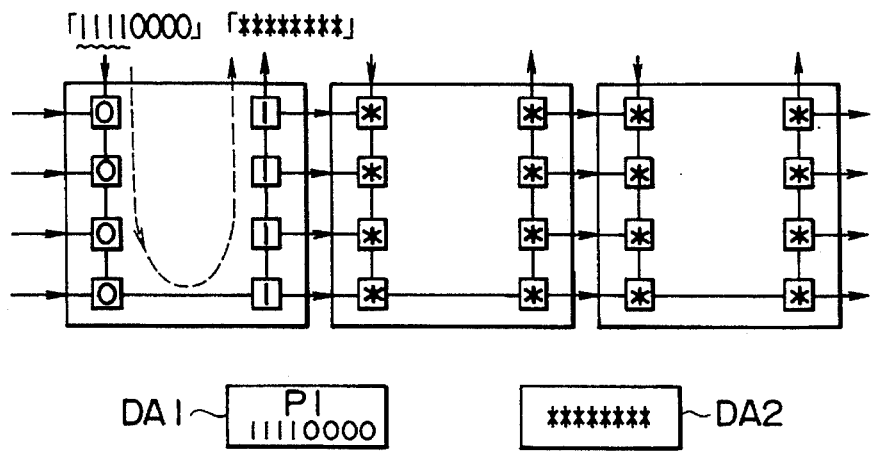
Figure 10C:
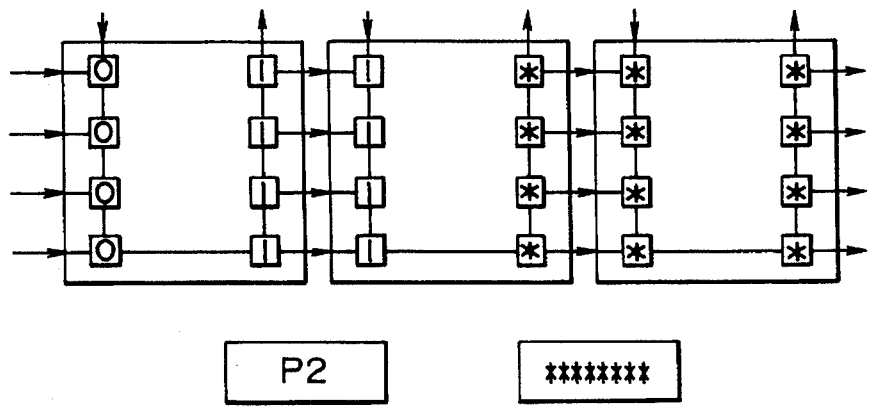
Figure 11A:
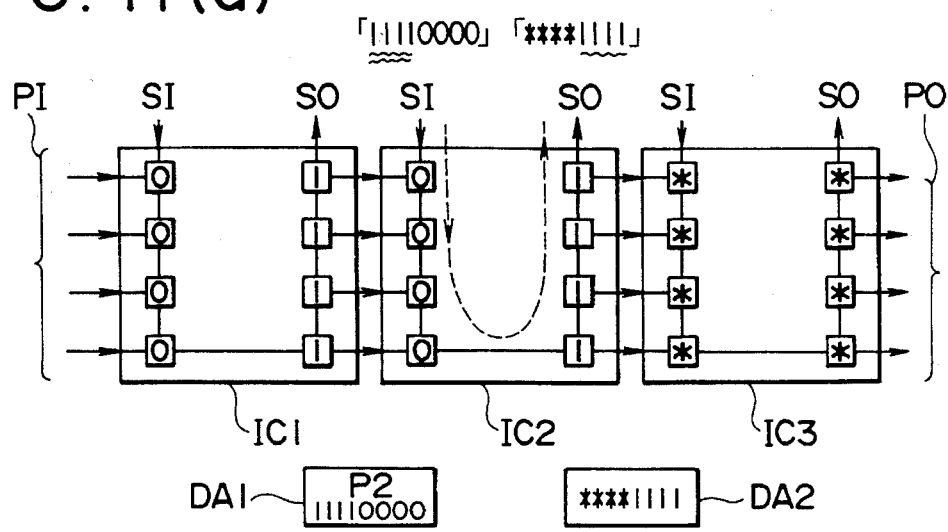
Figure 11B:
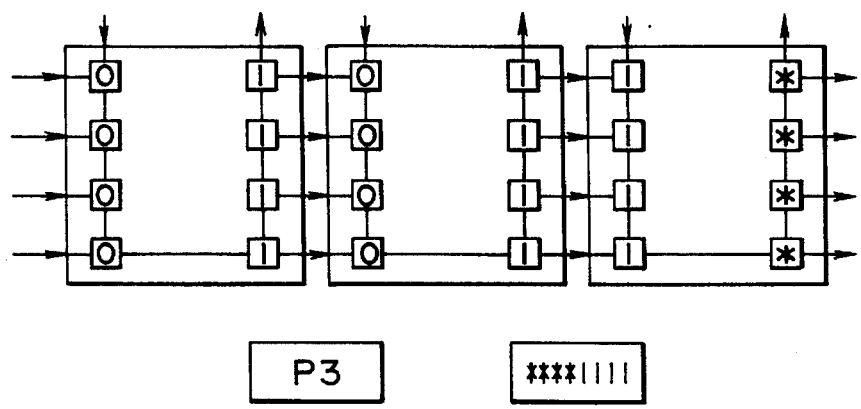

Subsequently, the microcomputer 6 reads the IC designating command and controls the chip select terminal CSB thereof to the "L" level to select the integrated circuit IC2, whereafter it reads out the category code C2 and the data P2 from the output data area DA1 of the RAM and transmits them to the serial input terminal SI of the integrated circuit IC2. The boundary scan control circuit 8 in the integrated circuit IC2 discriminates that the category code C2 represents a test mode, and changes over the switching circuits SW1 and SW2 to the terminals b side so that the test data "1111" at the parallel output terminals PO of the integrated circuit IC1 is caught at the parallel input terminals PO of the integrated circuit IC2 at a falling edge of a first clock (step S24 in FIG. 9; FIG. 10(c)). Thereafter, the data P2 is transferred to the boundary scan cells BC1 to BC8 at falling edges of clocks following the first clock. Thereupon, the data "****1111" (whose latter 4 bits "1111" have been caught from the test data "1111" from the parallel output terminals PO of the integrated circuit IC1) is read out by way of the serial output terminal SO of the integrated circuit IC2 and stored into the input data area DA2 of the microcomputer 6 (step S25 in FIG. 9; FIG. 11(a)). Thus, at the present step S25, reading out of the data P1 for testing the connection condition between the parallel output terminals PO of the integrated circuit IC1 and the parallel input terminals PI of the integrated circuit IC2 and writing of the data P2 for testing the connection condition between the parallel output terminals PO of the integrated circuit IC2 and the parallel input terminals PI of the integrated circuit IC3 are performed at a time. In this condition, the microcomputer 6 controls the chip select terminal CSB thereof to the "H" level to control the integrated circuit IC2 to a hold mode.

The latter 4 bits of the data "****1111" stored in the input data area DA2 of the microcomputer 6 is compared with the former 4 bits of the data P1= "11110000" which has been stored into the output data area DA1 at step S21 in FIG. 9, to test the connection condition between the parallel output terminals PO of the integrated circuit IC1 and the parallel input terminals PI of the integrated circuit IC2 (step S26 in FIG. 9). While the comparison may be executed by either of the microcomputer 6 and the testing apparatus 5, if the electronic apparatus testing system is constructed such that the comparison is executed by the microcomputer 6, then when the configuration of integrated circuits is changed, the program for the microcomputer 6 must be changed, but otherwise if the electronic apparatus testing system is constructed such that the comparison is executed by the testing apparatus 5, then since stored contents of the input data area DA2 are read into the testing apparatus 5 by way of the external bus interface 3, it is possible to cope with such change of the configuration of the integrated circuits as mentioned above only by changing the program for the testing apparatus 5.

Subsequently, the testing apparatus 5 transmits the data illustrated in FIG. 2 to the microcomputer 6. Upon reception of the data, the microcomputer 6 stores the data into the command area CA and the output data area DA1 of the RAM (step S27 in FIG. 9). Here, the boundary scan data of the received data includes the category code C3 for putting the integrated circuit IC3 into a test mode and data P3="11110000" for setting the parallel output terminals PO of the integrated circuit IC3 to the test data "1111"; and the IC designating command is a command designating the integrated circuit IC3.

Figure 11C:
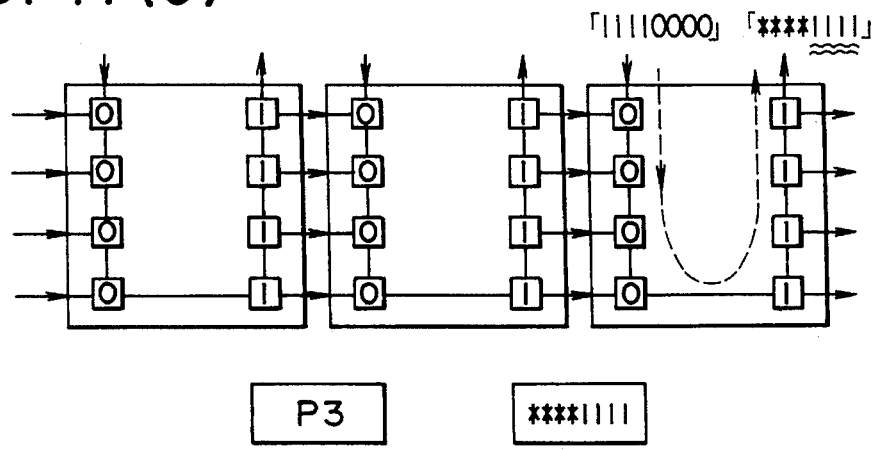
Figure 12:
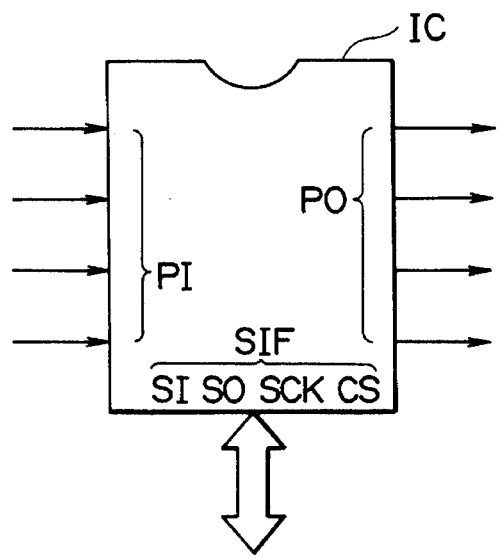
FIG. 12 is a diagrammatic view showing a construction of a conventional integrated circuit.
Figure 13:
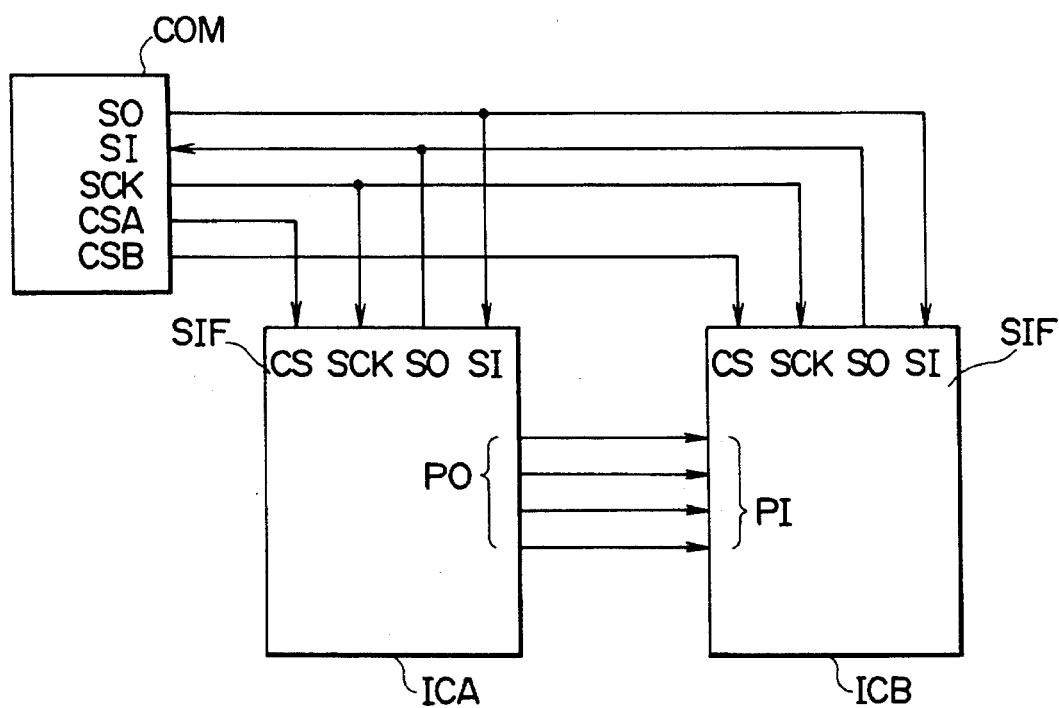
FIG. 13 is a wiring diagram illustrating a connection condition between a plurality of integrated circuits and a microcomputer.
Figure 14:
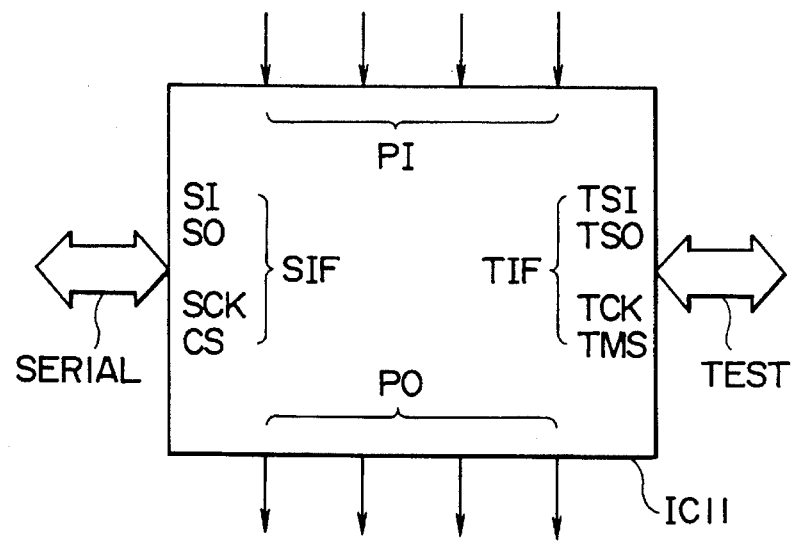
FIG. 14 is a diagrammatic view showing a construction of a conventional integrated circuit for boundary scan.

Subsequently, the microcomputer 6 reads the IC designating command and controls the chip select terminal CSC thereof to the "L" level to select the integrated circuit IC3, whereafter it reads out the category code C3 and the data P3 from the output data area DA1 of the RAM and transmits them to the serial input terminal SI of the integrated circuit IC3. The boundary scan control circuit 8 in the integrated circuit IC3 discriminates that the category code C3 represents a test mode, and changes over the switching circuits SW1 and SW2 to the terminals b side so that the test data "1111" at the parallel output terminals PO of the integrated circuit IC2 is caught at the parallel input terminals PO of the integrated circuit IC3 at a falling edge of a first clock (step S28 in FIG. 9; FIG. 1(b)). Thereafter, the data P3 is transferred to the boundary scan cells BC1 to BC8 at falling edges of clocks following the first clock. Thereupon, the data "****1111" is read out by way of the serial output terminal SO of the integrated circuit IC3 and stored into the input data area DA2 of the microcomputer 6 (step S29 in FIG. 9; FIG. 11(c)). Thus, at the present step S29, reading out of the test data P2 for testing the connection condition between the parallel output terminals PO of the integrated circuit IC2 and the parallel input terminals PI of the integrated circuit IC3 and writing of the data P3 for testing the connection condition between the parallel output terminals PO of the integrated circuit IC3 and the parallel input terminals PI of a following integrated circuit IC4 (not shown) are performed at a time.

The latter 4 bits of the data "****1111" stored in the input data area DA2 of the microcomputer 6 is compared with the former 4 bits of the data P2= "11110000" which has been stored into the output data area DA1 at step S23 in FIG. 9, to test the connection condition between the parallel output terminals PO of the integrated circuit IC2 and the parallel input terminals PI of the integrated circuit IC3 (step S30 in FIG. 9).

Thereafter, a test is performed successively for the integrated circuits IC4, IC5, ... (not shown) in a similar manner. Then, after the test using the test data "1111" is completed, the test mode described above is repeated changing the test data to "0000". As a result, results of comparison between the test data "1111" and "0000" inputted to the integrated circuits IC1 to IC3 and so forth and data outputted from the serial output terminals SO of the integrated circuits IC1 to IC4 and so forth are obtained first, and if any of the results of comparison indicates a difference, there is a failure such as incomplete disconnection in the signal line corresponding to the data of the difference.

It is to be noted that the present invention is not limited to the embodiment described above and various alterations are possible in accordance with the spirit and scope of the present invention, and the present invention does not exclude such alterations from the scope of the present invention. For example, when an integrated circuit does not include an ordinary signal processing circuit and switching circuits SW1 and SW2 such as an oscillation circuit or a modulation circuit, the electronic apparatus testing apparatus may be constructed such that, without using a category code, test data is fetched by way of the parallel input terminals to execute boundary scanning at a point of time when it is discriminated that the input signal level at the chip select terminal CS has changed to the "L" level. Further, while, in the embodiment described above, the testing apparatus transmits data to the microcomputer by way of the external bus interface, alternatively data may be transmitted to the internal communication bus by way of the external terminal section similarly as in the conventional electronic apparatus testing system shown in FIG. 18. Further, while, in the embodiment described above, the "L" level state at the chip select terminal CS and the clock terminal SCK is set active, alternatively the "H" level state may be set active.

Having now fully described the invention, it will be apparent to one of ordinary skill in the art that many changes and modifications can be made thereto without departing from the spirit and scope of the invention as set forth herein.

What is claimed is:

1. A method of testing the interconnection of first and second integrated circuits each including a parallel data input/output terminal, serial input and output terminals, and boundary scan cells associated with said parallel data input/output terminal, said first and second integrated circuits each selectively having a test mode in which the respective serial input and output terminals are operable to receive and supply test serial data and a non-test mode in which said serial input and output terminals are operable to receive and supply non-test serial data, and said parallel data input/output terminal of said first integrated circuit being connected to said parallel data input/output terminal of said second integrated circuit, the method comprising the steps of:

selectively setting said first and second integrated circuits in said test mode and said non-test mode;

supplying test data to said serial input terminal of said first integrated circuit when said first integrated circuit is in said test mode;

controlling said first integrated circuit to serially store said test data in said boundary scan cells and to supply the test data stored in said boundary scan cells as parallel data from said first integrated circuit at said parallel data input/output terminal;

controlling said second integrated circuit to store in its boundary scan cells said parallel data supplied to its parallel data input/output terminal from said parallel data input/output terminal of said first integrated circuit, and to serially supply the parallel data stored in said boundary scan cells as output test data from said second integrated circuit at its serial output terminal; and comparing the output test data supplied from said serial output terminal of said second integrated circuit with said test data supplied to said serial input terminal of said first integrated circuit as an indication of the state of said interconnection between said first and second integrated circuits.

2. The method of claim 1, wherein said first and second integrated circuits include respective chip selection terminals for enabling said first and second integrated circuits, and said method further comprises the step of providing an enable signal to said respective chip selection terminals of said first and second integrated circuits.

3. The method of claim 11, wherein said first and second integrated circuits are operable to be set to said test mode when a test mode select command is received at their respective serial input terminals, and said step of setting said first and second integrated circuits in said test mode is carried out by supplying said test mode select command to said serial input terminal of said first and second integrated circuits.

4. The method of claim 3, wherein said first integrated circuit is controlled to serially store said test data supplied to its serial input terminal in said boundary scan cells only when said test mode select command is supplied to its serial input terminal.

5. The method of claim 1, further including the step of supplying second test data to said serial input terminal of said second integrated circuit, and wherein said step of controlling said second integrated circuit includes controlling said second integrated circuit to serially store said second test data in its boundary scan cells when the parallel data stored in its boundary scan cells is serially supplied as said output test data from its serial output terminal.

6. The method of claim 5, wherein said step of controlling said second integrated circuit includes controlling said second integrated circuit to supply the second test data stored in its boundary scan cells as second parallel data from its parallel data input/output terminal.

7. The method of claim 6, further comprising a third integrated circuit having a parallel data input/output terminal, serial input and output terminals, and boundary scan cells associated with its parallel data input/output terminal is connected at its parallel data input/output terminal to said parallel data input/output terminal of said second integrated circuit, and said method further comprises the steps of:

controlling said third integrated circuit to store in its boundary scan cells said second parallel data supplied to its parallel data input/output terminal from said parallel data input/output terminal of said second integrated circuit, and to serially supply the second parallel data stored in said boundary scan cells of said third integrated circuit as second output test data from its serial output terminal; and comparing the second output test data supplied from said serial output terminal of said third integrated circuit with said second test data supplied to said serial input terminal of said second integrated circuit as an indication of the state of the interconnection between said second and third integrated circuits.

8. The combination of first and second integrated circuits each including a parallel data input/output terminal, serial input and output terminals, and boundary scan cells associated with said parallel data input/output terminal, said first and second integrated circuits each having a test mode in which the respective serial input and output terminals are operable to receive and supply test serial data and a non-test mode in which said serial input and output terminals are operable to receive and supply non-test serial data, and means connecting said parallel data input/output terminal of said first integrated circuit to said parallel data input/output terminal of said second integrated circuit; and apparatus for testing interconnections of said first and second integrated circuits, comprising:

means for selectively setting said first and second integrated circuits in said test mode and said non-test mode;

means operable in said test mode for supplying test data to said serial input terminal of said first integrated circuit;

first control means operable in said test mode for causing said first integrated circuit to serially store said test data in its boundary scan cells and to supply the test data stored in its boundary scan cells as parallel data from said first integrated circuit at its parallel data input/output terminal;

second control means operable in said test mode for causing said second integrated circuit to store in its boundary scan cells said parallel data supplied to its parallel data input/output terminal from said parallel data input/output terminal of said first integrated circuit, and to serially supply the parallel data stored in said boundary scan cells as output test data from said second integrated circuit at its serial output terminal; and means for comparing the output test data supplied from said serial output terminal of said second integrated circuit with said test data supplied to said serial input terminal of said first integrated circuit as an indication of the state of said interconnection between said first and second integrated circuits.

9. The combination of claim 8, wherein said first and second integrated circuits include respective chip selection terminals for enabling said first and second integrated circuits, and said apparatus further comprises means for providing an enable signal to said respective chip selection terminals of said first and second integrated circuits.

10. The combination of claim 8, further comprising a computer for controlling said means for setting said first and second integrated circuits in said test mode, for controlling said means for supplying test data to said serial input terminal of said first integrated circuit, and for controlling said means for comparing.

11. The combination of claim 8, wherein said first and second integrated circuits are operable to be set to said test mode when a test mode select command is received at their respective serial input terminals, and said means for setting said first and second integrated circuits in said test mode includes means for supplying said test mode select command to said serial input terminal of said first and second integrated circuits.

12. The combination of claim 11, wherein said first control means causes said first integrated circuit to serially store said test data supplied to its serial input terminal in its boundary scan cells only when said test mode select command is supplied to its serial input terminal.

13. The combination of claim 8, further comprising means for supplying second test data to said serial input terminal of said second integrated circuit, and wherein said second control means causes said second integrated circuit to serially store said second test data in its boundary scan cells when the parallel data stored in its boundary scan cells is serially supplied as said output test data from its serial output terminal.

14. The combination of claim 13, wherein said second control means causes said second integrated circuit to supply the second test data stored in its boundary scan cells as second parallel data from its parallel data input/output terminal.

15. The combination of claim 14, further comprising a third integrated circuit having a parallel data input/output terminal, serial input and output terminals; and means connecting boundary scan cells associated with the parallel data input/output terminal of said third integrated circuit at its parallel data input/output terminal to said parallel data input/output terminal of said second integrated circuit, and said apparatus further comprises:

third control means for causing said third integrated circuit to store in its boundary scan cells said second parallel data supplied to its parallel data input/output terminal from said parallel data input/output terminal of said second integrated circuit, and to serially supply the second parallel data stored in said boundary scan cells of said third integrated circuit as second output test data from its serial output terminal; and second comparing means for comparing the second output test data supplied from said serial output terminal of said third integrated circuit with said second test data supplied to said serial input terminal of said second integrated circuit as an indication of the state of the interconnection between said second and third integrated circuits.

* * * * *